United States Patent
Maiocchi et al.

(10) Patent No.: US 10,892,740 B2
(45) Date of Patent: Jan. 12, 2021

(54) DIGITAL FILTERING METHOD, CORRESPONDING CIRCUIT AND DEVICE

(71) Applicant: STMicroelectronics S.r.l., Agrate Brianza (IT)

(72) Inventors: Giuseppe Maiocchi, Villa Guardia (IT); Ezio Galbiati, Agnadello (IT); Michele Boscolo Berto, Sesto San Giovanni (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 74 days.

(21) Appl. No.: 16/240,915

(22) Filed: Jan. 7, 2019

(65) Prior Publication Data
US 2019/0245521 A1 Aug. 8, 2019

(30) Foreign Application Priority Data
Feb. 5, 2018 (IT) .......................... 102018000002401

(51) Int. Cl.
*H03H 17/02* (2006.01)
*G06F 7/523* (2006.01)
*H03H 17/04* (2006.01)

(52) U.S. Cl.
CPC ......... *H03H 17/0227* (2013.01); *G06F 7/523* (2013.01); *H03H 17/0225* (2013.01); *H03H 17/0248* (2013.01); *H03H 17/04* (2013.01); *H03H 2017/022* (2013.01)

(58) Field of Classification Search
CPC .................. H03H 17/0225; H03H 17/0227
See application file for complete search history.

(56) References Cited

U.S. PATENT DOCUMENTS

| | | | | |
|---|---|---|---|---|
| 4,791,597 A | | 12/1988 | Miron et al. | |
| 5,258,939 A | * | 11/1993 | Johnstone | H03H 17/0276 708/313 |
| 5,831,879 A | * | 11/1998 | Yom | H03H 17/0223 708/301 |
| 6,625,628 B1 | * | 9/2003 | Matsuura | H03H 17/0225 708/300 |

(Continued)

FOREIGN PATENT DOCUMENTS

EP 1026824 A2 8/2000

*Primary Examiner* — Chuong D Ngo
(74) *Attorney, Agent, or Firm* — Slater Matsil, LLP (57) ABSTRACT

A method includes receiving an input digital signal and applying the input digital signal to digital filter processing with a corner frequency to produce a filtered output digital signal. The digital filter processing includes a set of multiplication operations using a set of filter multiplication coefficients. The set of multiplication operations is performed by alternately using a first set of approximate multiplication coefficients and a second set of approximate multiplication coefficients different from the first set of approximate multiplication coefficients. The approximate multiplication coefficients in the first set of approximate multiplication coefficients and the second set of approximate multiplication coefficients approximate multiplication coefficients in the set of filter multiplication coefficients as a function of negative power-of-two values. The alternating of multiplication operations results in digital filter processing with average corner frequency approximating the corner frequency.

22 Claims, 6 Drawing Sheets

(56) References Cited

U.S. PATENT DOCUMENTS

2003/0088598 A1\* 5/2003 Nakayama ............ G06F 17/147
 708/300
2005/0008071 A1 1/2005 Bose et al.
2014/0379769 A1 12/2014 Mangano \* cited by examiner

FIG. 1

| N | C1=2⁻ᴺ | C2=1−C1 | $f_{c'}$ [Hz] |
|---|---|---|---|
| 2 | 0,25 | 0,75 | 922100 |
| 3 | 0,125 | 0,875 | 425680 |
| 4 | 0,0625 | 0,9375 | 205500 |
| 5 | 0,03125 | 0,96875 | 101070 |
| 6 | 0,015625 | 0,984375 | 50130 |
| 7 | 0,0078125 | 0,9921875 | 24966 |
| 8 | 0,00390625 | 0,99609375 | 12458 |
| 9 | 0,001953125 | 0,998046875 | 6223 |
| 10 | 0,0009765625 | 0,9990234375 | 3110 |
| 11 | 0,00048828125 | 0,999511719 | 1554 |
| 12 | 2,4414e-4 | 0,99975586 | 777 |
| 13 | 1,2207e-4 | 0,999878 | 388 |
| 14 | 6,1e-5 | 0,999939 | 194 |

| N1/N2 | 2 | 3 | 4 | 5 | 6 | 7 | 8 | 9 | 10 | 11 | 12 | 13 |
|---|---|---|---|---|---|---|---|---|---|---|---|---|
| 2 | 922100 | | | | | | | | | | | |
| 3 | 673890 | 425680 | | | | | | | | | | |
| 4 | 563800 | 315590 | 205500 | | | | | | | | | |
| 5 | 511900 | 263690 | 153600 | 101070 | | | | | | | | |
| 6 | 486115 | 237905 | 127815 | 75915 | 50130 | | | | | | | |
| 7 | 473533 | 225323 | 115233 | 63333 | 37548 | 24966 | | | | | | |
| 8 | 467279 | 219069 | 108979 | 57079 | 31294 | 18712 | 12458 | | | | | |
| 9 | 464162 | 215952 | 105862 | 53962 | 28177 | 15595 | 9341 | 6223 | | | | |
| 10 | 462605 | 214395 | 104305 | 52405 | 26620 | 14038 | 7784 | 4667 | 3110 | | | |
| 11 | 461827 | 213617 | 103527 | 51627 | 25842 | 13260 | 7006 | 3889 | 2332 | 1554 | | |
| 12 | 461439 | 213229 | 103139 | 51239 | 25454 | 12872 | 6618 | 3500 | 1944 | 1166 | 777 | |
| 13 | 461244 | 213034 | 102944 | 51044 | 25259 | 12677 | 6423 | 3306 | 1749 | 971 | 583 | 388 |
| 14 | 461147 | 212937 | 102847 | 50947 | 25162 | 12580 | 6326 | 3209 | 1652 | 874 | 486 | 291 |

DIGITAL FILTERING METHOD, CORRESPONDING CIRCUIT AND DEVICE

CROSS-REFERENCE TO RELATED APPLICATIONS

This application claims priority to Italian Patent Application No. 102018000002401, filed on Feb. 5, 2018, which application is hereby incorporated herein by reference.

TECHNICAL FIELD

Embodiments relate to a digital filtering method and corresponding circuit and device.

BACKGROUND

A digital filter is a component that receives as an input a discrete-time signal and provides as an output a filtered discrete-time signal, wherein the filtering comprises mathematical operations performed to the input discrete-time signal. Digital filters may be implemented in hardware (e.g., dedicating a portion of logic circuitry to the filter) or software (e.g., by signal processing in a processing unit).

For example, low pass digital filters may provide as an output a signal wherein components with a cutoff frequency higher than a certain frequency are attenuated, high pass digital filters may provide as an output a signal wherein components with a frequency lower than a certain cutoff frequency are attenuated, whereas band pass digital filters may provide as an output a signal wherein components outside a lower cutoff frequency and a higher cutoff frequency are attenuated.

A cutoff frequency may be defined as a corner or boundary frequency above or below which the signal being filtered begins to be reduced (attenuated or reflected) rather than passed through the filter (unchanged or enhanced). In general, the cutoff frequency may be the frequency at which the output signal response has a value being equal to a nominal passband value minus 3 dB.

Digital filters have one or more coefficients, calculated by algorithms or by digitalization processes from analog filters. The calculated coefficients may undergo a multiplication operation by, e.g. input, output and/or internal signals of the digital filter, in order to calculate an evolution of the filter outputs. These coefficients may comprise floating point values with several decimals, and the multiplication operations are conventionally performed by a dedicated part of a central processing unit, CPU.

Accordingly, using multiplier circuit blocks to implement multiplication operations may have one or more drawbacks, e.g., in hardware filters a certain amount of logic may be dedicated thereto, and/or in software filters a certain amount of calculation power may be dedicated thereto.

SUMMARY

One or more embodiments of the present invention address the drawbacks previously outlined.

One or more embodiments may include a corresponding circuit (e.g., a circuit including a digital filter according to one or more embodiments) and a device (e.g., a device including such circuit).

One or more embodiments may approximate one or more multiplication operations during filter calculations, in order to implement the multiplication operation by means of sums and/or shifts.

One or more embodiments may relate to a digital filter (e.g., a low pass filter and/or a high pass filter), having coefficients approximated to negative powers of two $2^{-N}$, i.e., exponentiations with number two as the base and negative integers $-N$ as the exponent, N being a positive integer.

One or more embodiments may also relate to a digital filter, wherein the approximated coefficients may be continuously switched between two (or more) values $C1=2^{-N1}$ and $C2=2^{-N2}$, in order to expand available desired frequencies.

In one example, an input digital signal comprising a sequence of samples is received and applied to digital filter processing with at least one corner frequency to produce a filtered output digital signal. The digital filter processing comprises a set of multiplication operations by a set of filter multiplication coefficients. The set of multiplication operations are performed by using alternatively a first set of approximate multiplication coefficients and a second set of approximate multiplication coefficients different from the first set of approximate multiplication coefficients. The approximate coefficients in the first set of approximate coefficients and the second set of approximate coefficients approximate the multiplication coefficients in the set of filter multiplication coefficients as a function of negative power-of-two values. The alternation of multiplications with the first set of approximate coefficients and multiplications with the second set of approximate coefficients results in digital filter processing with average corner frequency approximating the at least one corner frequency.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

In the following, a non-limiting example of realization of a low pass digital filter is provided, starting from its analog counterpart, the filter having unitary DC gain, cutoff frequency $f_c$=50 kHz and sampling time T=50 ns. It will be appreciated that, even if in the present non-limiting example a specific analog H(s) resp. digital H(z) transfer function of the digital filter is disclosed, such transfer functions are presented herein purely for the sake of brevity and understanding. However, one or more embodiments may relate to a digital filter comprising a generic digital transfer function H(z) including one or more multiplication operations.

One or more embodiments may thus relate to a digital filter, e.g. a low pass digital filter based on an analog filter having transfer function:

$$H(s) = \frac{b}{s+b}$$

where b represent a cutoff frequency of the low-pass filter in rad/s, i.e. $b=2\pi f_c$ ($f_c$ being the cutoff frequency in Hz).

A resulting digital filter transfer function H(z), calculated employing the sampling time T, may have equation:

$$H(z) = \frac{1-e^{-bT}}{z-e^{-bT}}$$

By substituting the cutoff frequency and the sampling time with the numeral values $f_c$=50 kHz and T=50 ns, a digital filter transfer function may thus be represented by equation:

$$H(z) = \frac{1-0.984415}{z-0.984415}$$

that may result, via calculations that are well known in the art, in the following digital low pass filter output evolution:

$$Y(n)=0.9884415*Y(n-1)+X(n-1)-0.9884415*X(n-1)$$

where n represents a discrete-time instant, X(n) represents a digital input signal of the digital filter, comprising a sequence of digitized samples, and Y(n) represents a digital output signal of the digital filter, comprising a sequence of digitized samples. In the present non-limiting example, therefore, two multiplication operations having coefficient c=0.9884415 may be present, with related drawbacks as previously discussed.

It was observed that, by substituting the coefficient c with an approximated value comprising a difference between a unitary value and a negative power-of-two value, i.e., $1-2^{-N}$, N being a positive integer, the multiplication operations could be implemented solely via shift and sum operations.

For example, in the present case, the coefficient c may be approximated by:

$$0.9884415 \approx 1-2^{-6}=1-0.015625=0.984375,$$

Here the difference between one and the sixth negative power-of-two may represent the closest approximation to the original multiplication coefficient c.

According to the approximation, the filter output evolution may be represented by:

$$Y(n)=(1-2^{-6})*Y(n-1)+X(n-1)-(1-2^{-6})*X(n-1)$$

which becomes $$Y(n)=Y(n-1)-2^{-6}*Y(n-1)+2^{-6}*X(n-1)$$

The multiplication operations by the power-of-two values may be implemented via shifting operations, e.g. $2^{-6}*Y(n-1)$ may be implemented by means of a shifting circuit block that right shifts the value of the output signal Y(n-1) of 6 bits. Accordingly, the filter output evolution may be implemented by shift and sum operations:

$$Y(n)=Y(n-1)-[Y(n-1)>>6]+[X(n-1)>>6].$$

It will be appreciated that the approximated cutoff frequencies are discrete, and, in some cases, the original desired cutoff frequency may not be achieved. However, a precise cutoff frequency is seldom necessary. For example, the present invention may relate to filters that may be employed for eliminating glitches from signals and/or for limiting a signal bandwidth which do not require precise frequencies.

A negligible effect may occur even if the approximated cutoff frequency is different from the original non-approximated frequency. That is, glitches may be eliminated even if the cutoff frequency is for example 10 KHz, 10.5 KHz or 9.5 KHz, and a band pass filter may operate whether a bandwidth is limited to 10 KHz, 9.5 KHz or 10.5 KHz. One or more embodiments may have an advantage over prior art digital filters, wherein multiplier circuit blocks are exploited even if a precise desired frequency is not desired.

While the present non-limiting example, for the sake of simplicity, represents the possibility of approximating one multiplication coefficient, the possibility exists to extend the method according to one or more embodiments to a transfer function of a digital filter having a plurality of multiplications with different coefficients.

Figure 1:
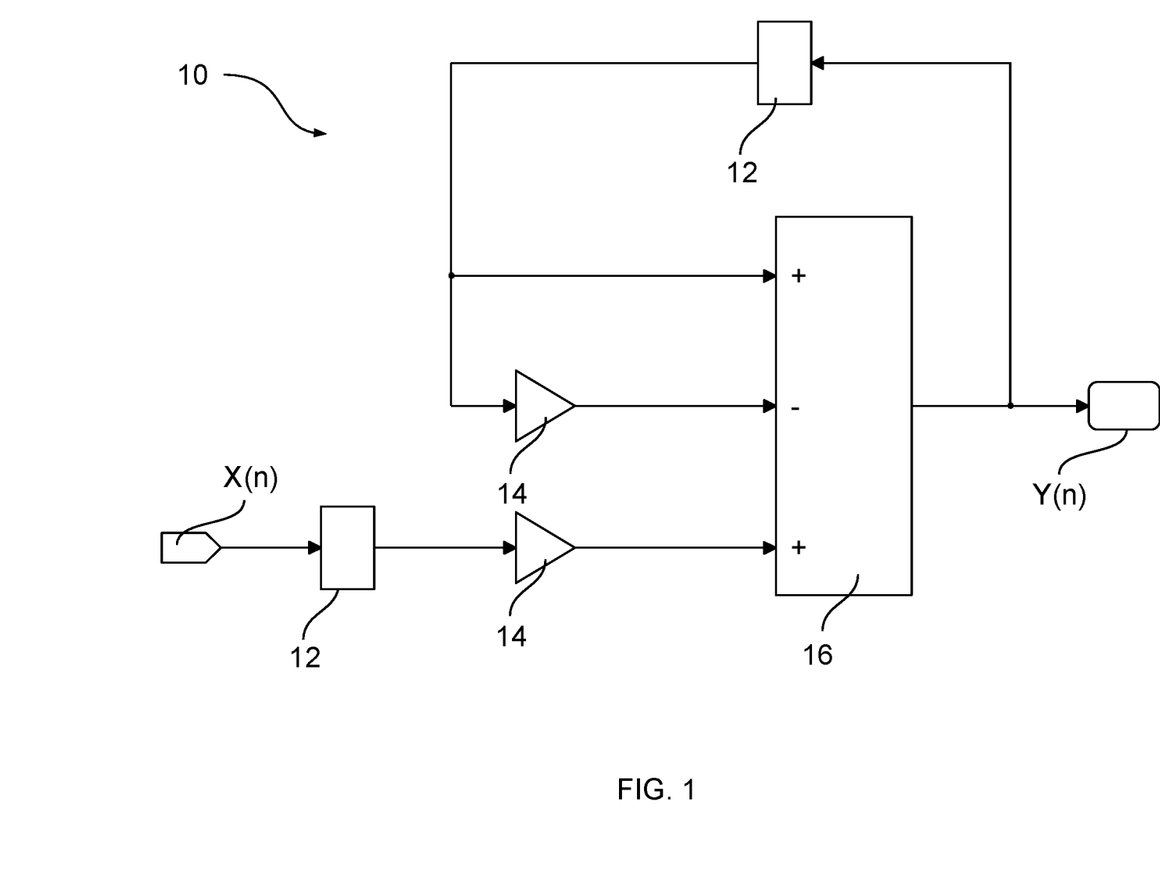
FIG. 1 represents an example of a digital filter according to one or more embodiments.

In one or more embodiments, the digital filter 10 may comprise the circuit blocks exemplified in FIG. 1, and the digital filter 10 may receive, at an input node, a digital input signal X(n), comprising a sequence of digitized samples, and may provide, after filtering, a digital output signal Y(n), comprising a sequence of digitized samples, at an output node.

In one or more embodiments, the digital filter 10 may comprise one or more circuit blocks, to filter the digital input signal X(n) and/or the digital output signal Y(n). The illustrated example includes a delaying circuit block 12, which may receive as an input a signal, e.g. X(n), and may provide as an output the signal delayed of a discrete-time instant, e.g. X(n-1).

A right shifting circuit block 14 may implement a right bit shifting operation (i.e., a multiplication of a signal by a negative power of two value $2^{-N}$) as previously discussed. The circuit block 14 receives as an input a signal, e.g. X(n), and provides as an output the signal right shifted of N bits, e.g. [X(n)>>N].

An adder 16 may receive as an input two or more signals, e.g. X(n) and Y(n), and provide as an output a sum—with sign—of the two or more input signals, e.g., X(n)+Y(n) or X(n)-Y(n).

In the embodiment exemplified in FIG. 1, the digital input signal X(n) may be processed, e.g., the digital input signal X(n) may be delayed (12) of a discrete-time instant, and right shifted (14) of N bits (i.e., of 6 bits in the present non-limiting example). The resulting digital input signal X(n) may thus comprise a first operand in the adder 16.

The adder 16 may implement a sum—with sign—between three operands. For example, it may sum the first operand, a second operand and a third negative operand.

The second operand may comprise the output signal Y(n), being delayed (12).

The third negative operand may comprise the output signal Y(n) processed, wherein the output signal may be delayed (12), right shifted (14) of 6 bits, and negated (16). The resulting third operand may thus comprise the processed output signal [Y(n−1)>>N].

The output signal Y(n) may then be obtained as the output of the adder 16, i.e., the sum with sign of the first, second and third operands.

Accordingly, in one or more embodiments as exemplified in FIG. 1, the digital filter 10 may not comprise multiplier circuit blocks.

It was observed that the approximated coefficients $C1=2^{-N}$ and $C2=1-C1=(1-2^{-N})$ may cause the digital filter 10 to behave differently. For example, the digital filter 10 may have a cutoff frequency $f_c'$ that may differ from the cutoff frequency $f_c$ of the original filter. For example, in the digital filter 10 previously discussed and exemplified in FIG. 1, the cutoff frequency $f_c'$ may have value 50.130 kHz, instead of the original frequency value $f_c$=50 kHz.

Figure 2:
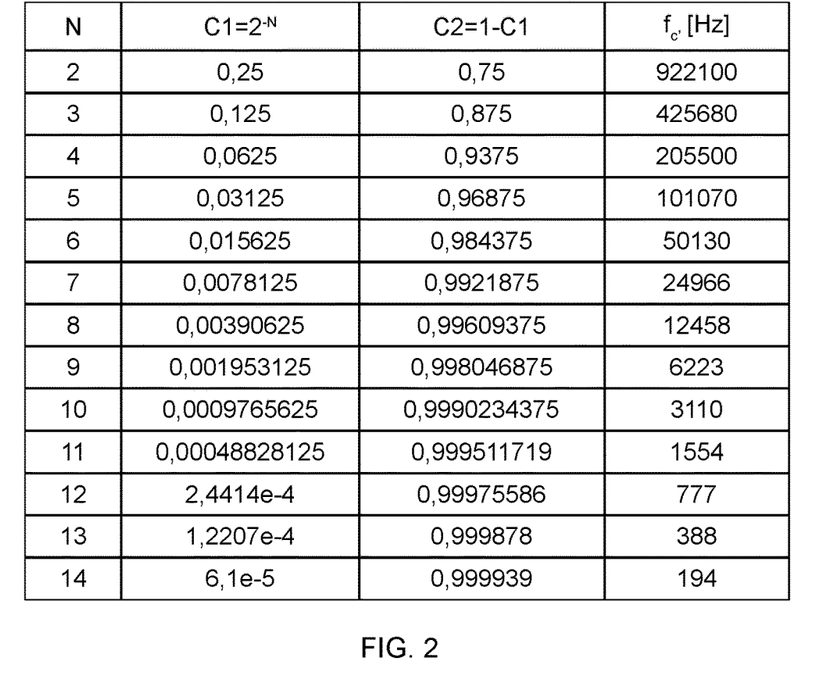
FIG. 2 is exemplary of features of one or more embodiments.

Accordingly, it was observed that approximating the multiplication coefficient with $C1=2^{-N}$ and with a difference (C2=1−C1) between the unitary value and a negative power of two C1, may limit the cutoff frequencies $f_c'$ of the approximated digital filter to the values that are illustrated in FIG. 2, wherein N represents the possible values of the power-of-two exponent, C1 represents the corresponding power-of-two value, C2 represents the difference between the unitary value and the power-of-two value C1, and $f_c'$ represents the approximated cutoff frequency calculated as:

$$f_{c'} = \frac{1}{2\pi T} * \arccos\left(\frac{1 + C_2^2 - 2C_1^2}{2C_2}\right)$$

where T is the digital filter sampling time (in the present example 50 ns). Of course, the table can be continued with additional values of N.

Figure 3:
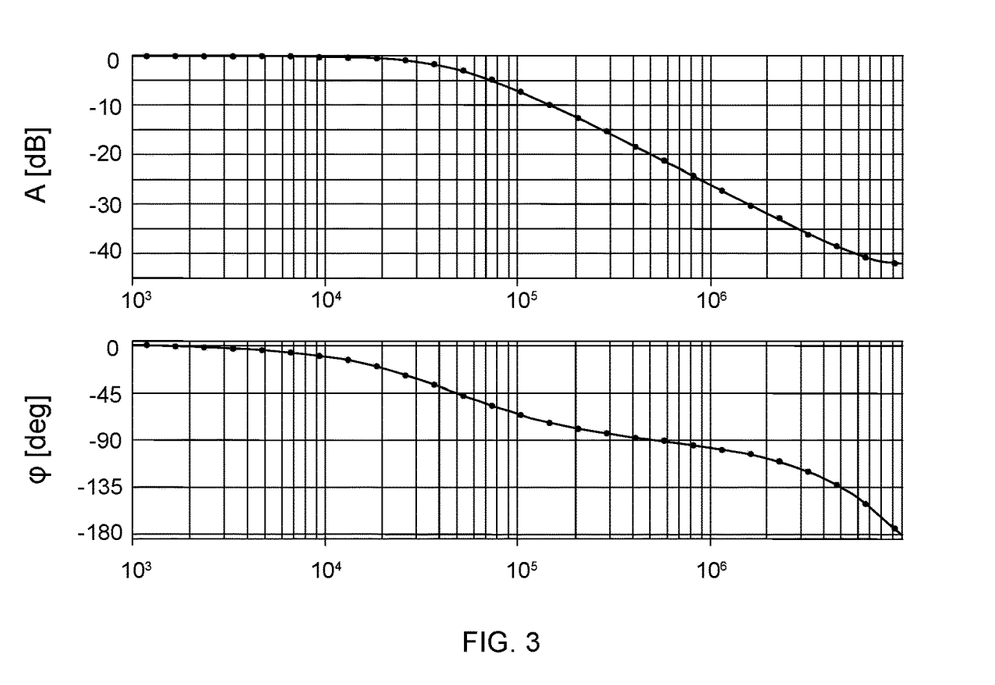
FIG. 3 represents a Bode diagram for a conventional digital filter and a digital filter according to one or more embodiments.

FIG. 3 exemplifies a Bode diagram, magnitude A and phase φ, for a low pass digital filter (full line), implemented using multiplication circuit blocks, and for an approximated digital filter (dots), such as the digital filter of FIG. 1. The digital filters may have cutoff frequencies $f_c$=50 kHz and $f_c'$=50.130 kHz, respectively. The approximation may be considered acceptable for certain applications, insofar as the magnitude A and phase φ behaviors of the low pass digital filter and the approximated low pass digital filter may be considered as about superimposing.

It was observed that, once the sampling time T is decided, only a discrete number of cutoff frequencies $f_c'$ may be possible for the approximated (e.g., low pass) digital filter, due to the discrete possible negative power of two values C1. That is, by approximating the multiplication operations of the filter using power-of-two values ($C1=2^{-N}$), the resulting digital filter may have available cutoff frequencies lying in a discrete and restricted values domain. In many cases, the approximation may be acceptable. However it was observed that an improved solution may be possible.

Figure 4:
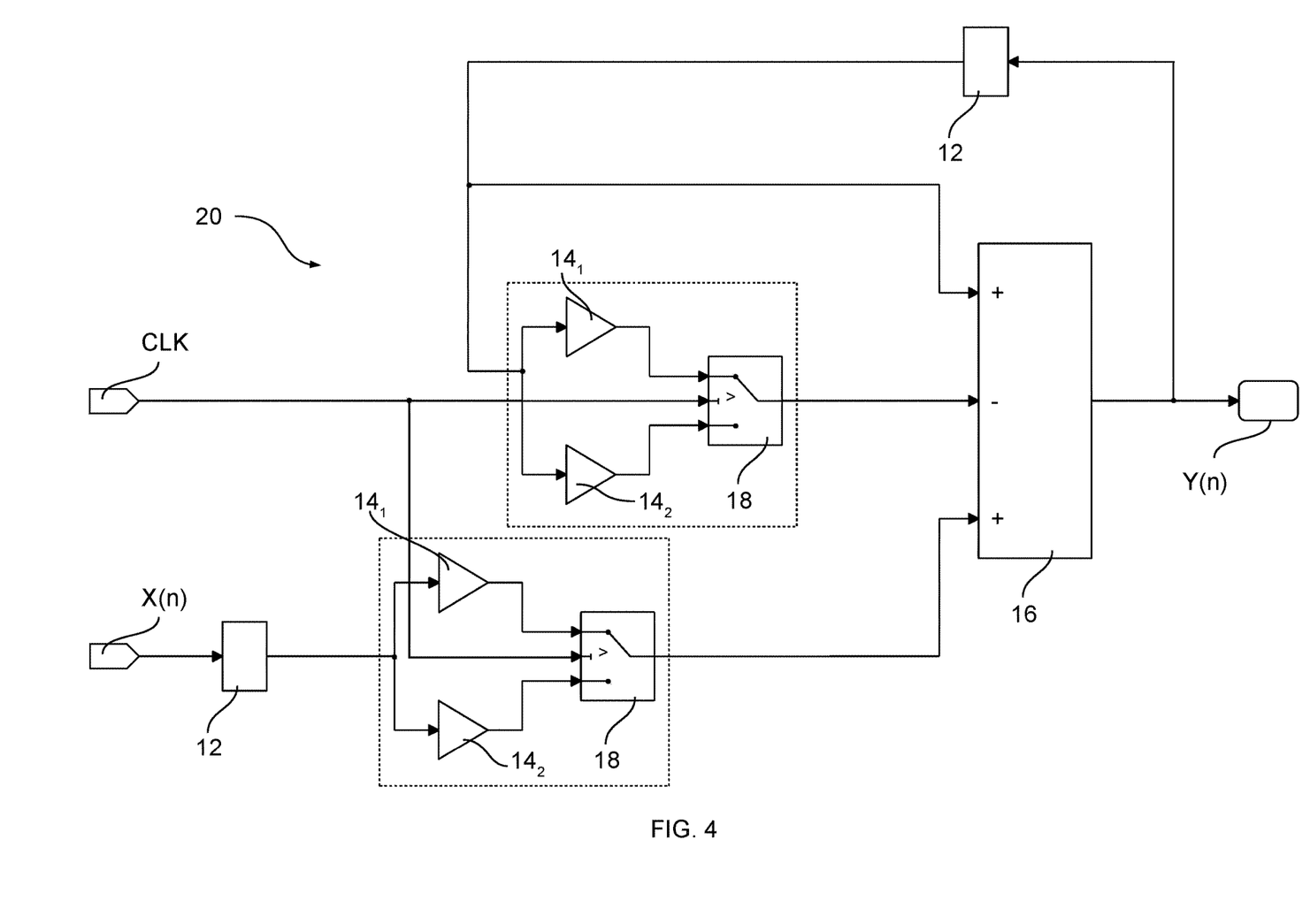
FIG. 4 represents an example of a digital filter according to one or more embodiments.

One or more embodiments may thus facilitate achieving a digital filter 20, that may be based on the digital filter 10 of FIG. 1 and that may allow to extend a domain of available cutoff/border frequencies $f_c'$. FIG. 4 represents a non-limiting example of a low pass digital filter 20 based on the digital filter 10 of FIG. 1, wherein the shifting circuit blocks 14 may be substituted by first shifting circuit blocks $14_1$, second shifting circuit blocks $14_2$ and switches 18.

According to the approximated digital filter 10 of FIG. 1, the choice of a certain exponent N of a negative power-of-two may result in a certain approximated cutoff frequency $f_c'$. For example, a first digital filter 10 having a first exponent $N_1$ may have a first approximated cutoff frequency $f_{c1}'$, whereas a second digital filter 10 having a second exponent $N_2$ may have a second approximated cutoff frequency $f_{c2}'$. It was observed that, if the shifting circuit blocks of the digital filter 20 comprise an alternation between the shifting circuit blocks 14 of the first digital filter and the shifting circuit blocks 14 of the second digital filter, the cutoff frequency fc' of the digital filter 20 may result in an average between the first approximated cutoff frequency $f_{c1}'$ and the second approximated cutoff frequency $f_{c2}'$.

In other words, the filtering process of the digital filter 20 may be alternatively based on the filtering circuit blocks of the first digital filter and the filtering circuit blocks of the second digital filter.

In the non-limiting example of FIG. 4, the digital filter 20 may be based on a first approximated low pass digital filter 10 and a second approximated low pass digital filter 10, having a common sampling time T=50 ns, and, respectively:

$N1=10, f_{c1}'$=3110 Hz, and $N2=9, f_{c2}'$=6223 Hz.

Accordingly, if the output of the switches 18 comprised in the shifting circuit blocks switch (e.g., at every clock pulse rising edge) seamlessly between the output of the first shifting circuit block $14_1$ implementing a right shift of $N_1$ bits and the output of the second shifting circuit block $14_2$ implementing a right shift of $N_2$ bits, the cutoff frequency $f_c'$ of the digital filter 20 may result in the average between the first filter cutoff frequency $f_{c1}'$ and the second filter cutoff frequency $f_{c2}'$, that is about $f_c'=_4666$ Hz.

According to one or more embodiments, the right shifting circuit blocks of the digital filter 20 may thus include a set of switches 18 cooperating with a set of first shifting circuit blocks $14_1$ and a set of second shifting circuit blocks $14_2$. The shifting circuit blocks of the digital filter 20 may receive as input a first signal and provide as an output a second signal. The first shifting circuit block $14_1$ may right shift the first signal of $N_1$ bits, and the second shifting circuit block $14_2$ may right shift the first signal of $N_2$ bit, respectively.

The signals output from the first and second shifting circuit block, $14_1$ and $14_2$, may be input to the switch 18 that may in turn transmit, as an output, one of these signals depending on clock pulses of a clock signal CLK, with the clock signal CLK that may have clock period $T_C$ corresponding to the digital processing rate, that is the clock period $T_C$ may substantially correspond to the sampling time $T_C$=T.

Accordingly, a shifting circuit block of the digital filter 20 may be implemented by a shifting circuit block of the set of first shifting circuit blocks $14_1$, a shifting circuit block of the set of second shifting circuit blocks $14_2$ and a switch of the set of switches 18.

The switches 18 may be driven by the clock signal CLK, that may switch the output of the switches 18 for example at each clock pulse, e.g., at the rising edge of the clock pulse. Accordingly, the filtering may comprise alternating between right shifting the signals of $N_1$ or $N_2$ bits.

Thus, in one or more embodiments, a wider range of cutoff frequency may be possible. In case of the low pass digital filter 20 exemplified in FIG. 4, possible approximated cutoff frequencies $f_c'$ may be illustrated in FIG. 6, wherein the rows represent the number of bits $N_1$ for the first shifting circuit blocks $14_1$, the columns represent the number of bits $N_2$ for the second shifting circuit blocks $14_1$, and the elements of the table represent the possible resulting cutoff frequencies $f_c'$ in Hz of the digital filter 20 having sampling time T=50 ns.

It will be appreciated that the diagonal of the table may comprise values representing a digital filter 20 comprising first shifting circuit blocks $14_1$ and second shifting circuit blocks $14_2$ having same number of bits, i.e. N1=N2, resulting therefore in the cutoff frequencies $f_c'$ illustrated in FIG. 2.

Figure 5A:
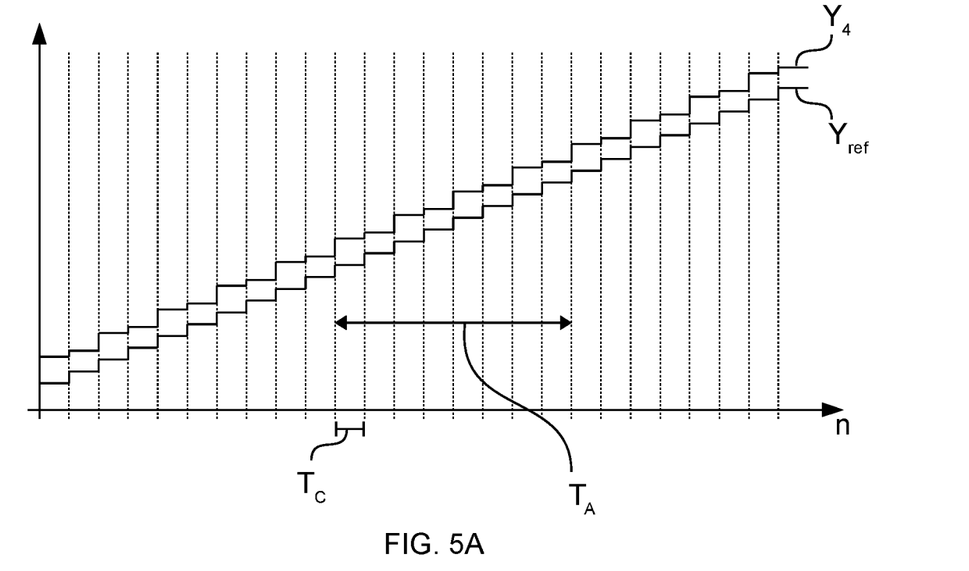
FIGS. 5A, 5B and 6 are exemplary of features of one or more embodiments.
Figure 5B:
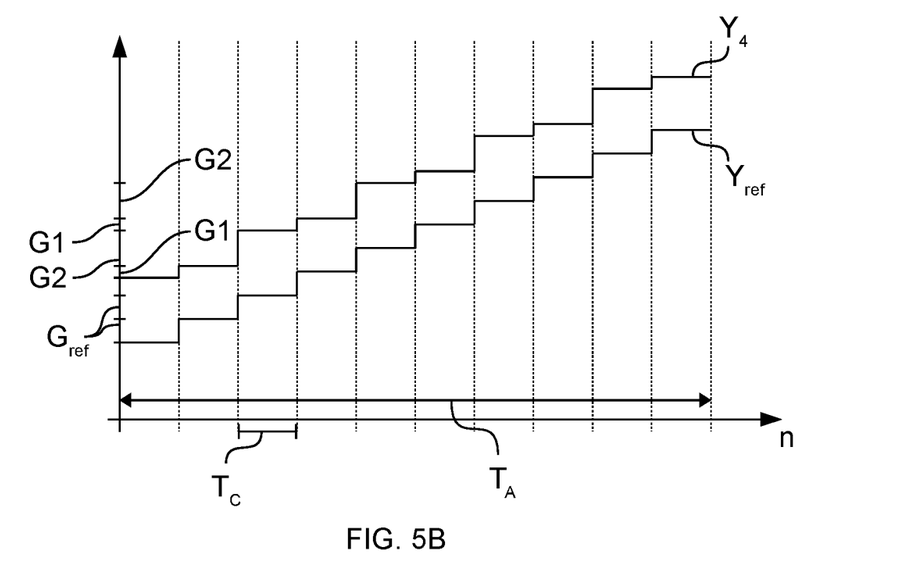

FIGS. 5A and 5B exemplify the behavior of the digital output signal Y(n) sampled (digitized) at time instants n, in case of a digital filter 20 as exemplified in FIG. 4, i.e. an approximated output signal $Y_4$, and in case of a reference digital filter, i.e. a reference output signal $Y_{ref}$. In particular, FIG. 5B represents a time portion $T_A$ of FIG. 5A.

In the non-limiting example of FIGS. 4, 5A and 5B, the digital filter 20 may be based on a first and a second approximated digital filter, having a common sampling time T=50 ns, and, respectively:

$N1=10, f_{c1}'=3110$ Hz, and $N2=9, f_{c2}'=6223$ Hz.

Conversely, the reference digital filter may have a non-approximated cutoff frequency fc=4666 Hz, with the reference digital filter including multiplier circuit blocks.

Accordingly, the output signal $Y_4$ may comprise a sequence of steps that may alternate depending on clock pulses $T_C$ of the clock signal CLK, between a first step G1, which represents the output signal $Y_4$ when the output of the switches 18 of the digital filter 20 is the output of the first shifting blocks $14_1$, and a second step G2, which represents the output signal $Y_4$ when the output of the switches 18 of the digital filter 20 is the output of the second shifting blocks $14_2$.

The second step G2, which may represent the output signal $Y_4$ when the digital filter 20 is based on the digital filter 10 having cutoff frequency $f_{c1}'=3110$ Hz, may have a smaller value with respect to the first step G1, that may represent the output signal $Y_4$ when the digital filter 20 is based on the digital filter 10 having cutoff frequency $f_{c2}'=6223$ Hz.

Conversely, the output signal $Y_{ref}$ of the reference digital filter may comprise a sequence of steps, having same amplitude $G_{ref}$.

In one or more embodiments, however, the resulting cutoff frequencies of the reference digital filter and the approximated digital filter 20 may coincide, insofar as the step amplitude $G_{ref}$ of the reference digital filter may substantially correspond to an average between the amplitude of the first step G1 and the amplitude of the second step G2.

It will be appreciated that, herein, the switches 18 are exemplified as alternating output every clock cycle, however the possibility exists of switching output at different time intervals.

The approximation according to one or more embodiments may be applied to different types of digital filters including one or more multiplication operations. For example, a high pass filter 30 according to one or more embodiments may be exemplified in FIG. 7.

Figure 7:
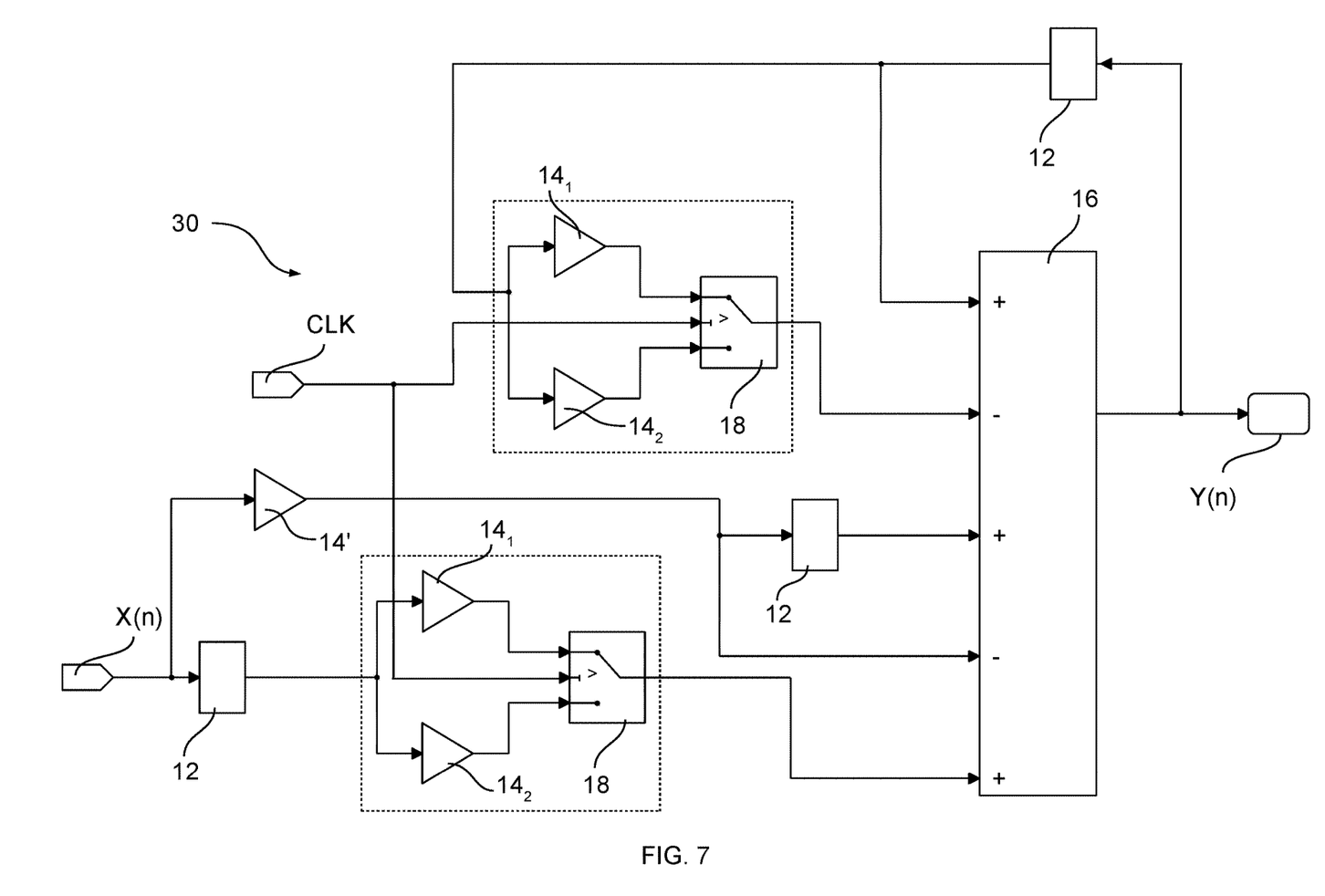
FIG. 7 represents an example of a digital filter according to one or more embodiments.

A high pass digital filter 30 may be based on an analog filter having transfer function:

$$H(s) = \frac{b*(s+a)}{a*(s+b)}$$

where a and b are coefficients that may be different from each other. A resulting digital filter transfer function H(z), calculated employing the sampling time T, may have equation:

$$H(z) = \frac{\frac{b}{a}*(z-1)+1-e^{-bT}}{z-e^{-bT}}$$

where a is a high pass cutoff frequency in rad/s, b is a low pass cutoff frequency in rad/s, which is higher than the high pass cutoff frequency a (b>>a) and permits the realization of the high pass digital filter 30, and b/a is a gain of the high pass digital filter 30.

Via calculations that are well known in the art, the following high pass digital filter 30 output evolution may result:

$$Y(n) = e^{-bT}*Y(n-1) + \frac{b}{a}*X(n) + \left[1 - \frac{b}{a} - e^{-bT}\right]*X(n-1)$$

where n represents a discrete-time instant, X(n) represents a digital input signal of the digital filter 30 and Y(n) represents a digital output signal of the digital filter 30.

In the present non-limiting example, therefore, two multiplication coefficients may be present, different from the unitary value, i.e. $e^{-bT}$ and $$\frac{b}{a}.$$

In one or more embodiments, the multiplication coefficient b/a may be approximated as a power-of-two value. For example, one or more embodiments may comprise selecting a desired high pass border frequency a and selecting a desired low pass border frequency b, so that the low pass border frequency is higher than the high pass border frequency and so that the low pass border frequency b may comprise a multiplication between the cutoff frequency a and a power-of-two value with exponent M (M being a positive integer), i.e. $b'=2^M*a$.

Figure 6:
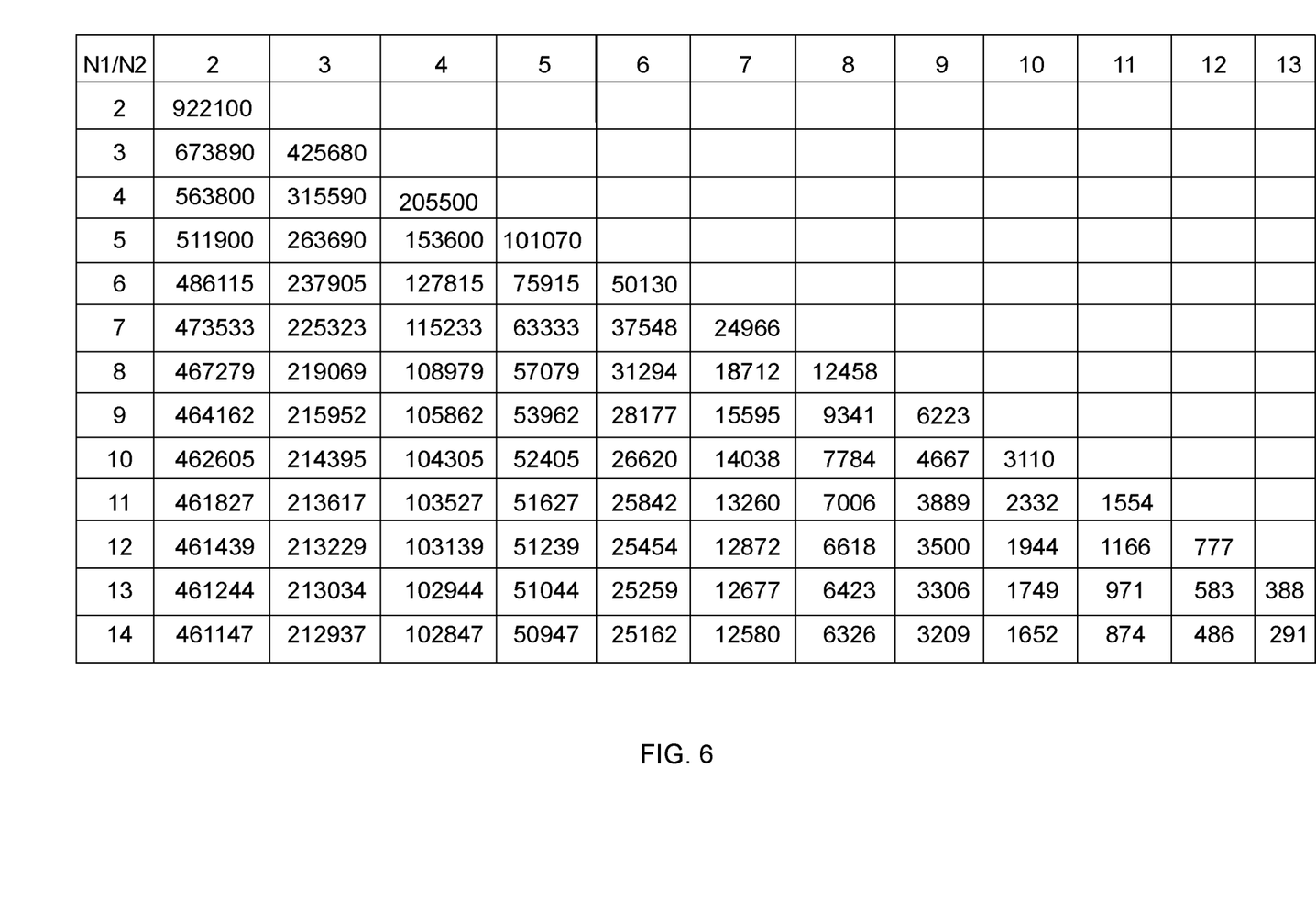

The method may further include approximating the desired low pass border frequency b' with a cutoff frequency, for example, an approximated cutoff frequency $f_c'$ as listed in FIG. 6, and calculating an approximated high pass cutoff frequency a', as a function of the approximated low pass cutoff frequency b', i.e. $a'=b'/2^M$.

The approximated frequency b' may be substituted in the multiplication coefficients, thereby obtaining:

$e^{-bT} = e^{-b'T}$, which may be approximated as previously described, and $$-\frac{b}{a} = \frac{b'}{a'} = \frac{2^M a'}{a'} = 2^M.$$

For example, for the high pass digital filter 30 of FIG. 7, having a desire high pass frequency a=3 kHz and a sampling time T=50 ns.

The frequency b may be approximated (b=2^M*a) as a multiplication between the high pass frequency a and a power-of-two value having exponent M, being a positive integer. The exponent M may be selected so that the frequency b may be close to a cutoff frequency listed in the table of FIG. 6: for example, M=3, so that b=2³*3 kHz, b=24 kHz.

The closest frequency listed in FIG. 6 may be considered b'=24966 Hz and the approximated high pass cutoff frequency may have value a'=b'/8=3121 Hz. Accordingly, the digital filter 30 may have an approximated high pass cutoff frequency a, however, the digital filter 30 may also feature a multiplication with the gain b/a that may be implemented with a shifting circuit block 14' rather than a multiplier.

The output evolution of the high pass digital filter 30 may thus include:

$$Y(n) = e^{-b'T} * Y(n-1) + 8*X(n) + [1 - 8 - e^{-b'T}]*X(n-1)$$

Where the exponential coefficient $e^{-bT}$ may be approximated as previously discussed. In the present non-limiting example, the chosen exponent values may comprise $N_1$=7 and $N_2$=8.

Accordingly, the output evolution may be rewritten as:

$$Y(n) = (1 - 2^{-N_i}) * Y(n-1) + 8*X(n) + [-8 + 2^{-N_i}]*X(n-1)$$

where $N_i$ may comprise value $N_1$ or $N_2$ depending on clock pulses of a clock signal CLK.

In one or more embodiments, the high pass digital filter 30 may be realized according to one or more embodiments as exemplified in FIG. 4.

The shifting circuit blocks in FIG. 7 may correspond to the shifting circuit blocks already discussed.

In the present non-limiting example, a left shifting circuit block designated with reference number 14' may left shift a received signal of 3 bits, thereby resulting in a multiplication of the received signal by a positive power-of-two value having exponent M=₃.

Also, the right shifting circuit blocks may be implemented via a first $14_1$ and second $14_2$ right shifting circuit block plus a switch 18. The right shifting circuit blocks may receive a signal which may be right shifted by the first $14_1$ and second $14_2$ right shifting circuit blocks of $N_1$=7 and $N_2$=8 bits, thereby implementing multiplications by negative power-of-two values having exponent $N_1$ and $N_2$, respectively. The switch 18 may receive as an input the signals right shifted of $N_1$ and $N_2$ bits, and may provide as an output one of these signals depending on clock pulses of the clock signal CLK. For example, the output of the switch 18 may change at each clock pulse of the clock signal CLK.

Thus, in the non-limiting example of FIG. 7, the high pass digital filter 30 may receive, at an input node, a digital input signal X(n), comprising a sequence of digitized samples, and provide a filtered digital output signal Y(n), comprising a sequence of digitized samples, at an output node. An adder 16 may be comprised in the digital filter 30, which may receive as an input a first, second, third, fourth and fifth operand, and provide as an output a sum—with sign—thereof. The output of the adder 16 may comprise the output signal Y(n) of the high pass digital filter 30.

The first operand, input to the adder 16, may comprise the output signal, delayed 12 of a time instant, i.e., Y(n−1).

The second operand input to the adder 16 may comprise the output signal, delayed 12 of a time instant, passed through a right shifting circuit block $14_1$, $14_2$, 18 as previously described and negated, i.e., the integer that may be closest to $-[Y(n) >> N_i]$, wherein i may be 1 or 2, depending on the clock pulses of the clock signal CLK.

The third operand, input to the adder 16, may comprise the input signal passed through a left shifting circuit block 14' as previously described and delayed 12 of a time instant, i.e., $[X(n-1) << 3]$.

The fourth operand, input to the adder 16, may comprise the input signal passed through a left shifting circuit block 14' as previously described, i.e., $[X(n) <<_3]$.

The fifth operand, input to the adder 16, may comprise the input signal passed through a right shifting circuit block $14_1$, $14_2$, 18 as previously described, delayed 12 of a time instant, i.e., $[X(n-1) >> N_i]$, wherein i may be 1 or 2, depending on the clock pulses of the clock signal CLK.

One or more embodiments may thus relate to a method, comprising receiving an input digital signal (e.g., X(n)) comprising a sequence of (e.g. digitized) samples and applying to the input digital signal digital filter (e.g., low pass 10, 20 or high pass 30) processing with at least one (e.g. lower and/or upper) corner frequency (e.g. $f_c$, a, b) to produce a filtered output digital signal (e.g. Y(n)). The digital filter processing comprises a set of multiplication operations by a set of filter multiplication coefficients (e.g. $e^{-bT}$, b/a). The set of multiplication operations is performed by using alternatively a first set of approximate multiplication coefficients (e.g., C2 with exponent $N_1$) and a second set of approximate multiplication coefficients (e.g., C2 with exponent $N_2$) different from the first set of approximate multiplication coefficients.

In one or more embodiments the approximate coefficients in the first set of approximate coefficients and the second set of approximate coefficients may approximate the multiplication coefficients in the set of filter multiplication coefficients as a function of negative power-of-two values (e.g., C1), and the alternation of multiplications with the first set of approximate coefficients and multiplications with the second set of approximate coefficients may result in digital filter processing with an average corner frequency (e.g., $f_c'$) approximating the at least one corner frequency.

In one or more embodiments, the input digital signal may comprise a sequence of samples clocked at a clock frequency (e.g., CLK), and the method may comprise alternating multiplication operations with the first set of approximate coefficients and the second set of approximate coefficients synchronously with the clock frequency.

In one or more embodiments, the input digital signal may comprise a sequence of samples clocked by a sequence of clock pulses at the clock frequency, and the method may comprise switching between multiplication operations with the first set of approximate coefficients and multiplication operations with the second set of approximate coefficients at each pulse in the sequence of clock pulses.

In one or more embodiments, the approximate coefficients in the first set of approximate coefficients and the second set of approximate coefficients may comprise coefficients which may approximate the multiplication coefficients in the set of filter multiplication coefficients as the difference between a unitary value and a negative power-of-two value.

One or more embodiments may comprise coupling to at least one coefficient in the set of filter coefficients: a first approximate coefficient in the first set of approximate coefficients, selected out of a plurality of candidate first approximate coefficients, and/or a second approximate coefficient in the second set of approximate coefficients selected out of a plurality of candidate second approximate coefficients.

One or more embodiments may comprise selecting the first approximate coefficient in the first set of approximate coefficients and/or the second approximate coefficient in the second set of approximate coefficients, as a function of the difference between the at least one corner frequency and the average corner frequency approximating the at least one corner frequency.

One or more embodiments may relate to a circuit that may comprise an input node configured for receiving an input digital signal (e.g. X(n)) comprising a sequence of samples. A filter processor (e.g., 10, 20, 30) is configured for applying to the input digital signal digital filter processing with at least one corner frequency to produce a filtered output digital signal (e.g. Y(n)) at an output node.

In one or more embodiment, the digital filter processor may comprise a set of multiplication circuit blocks configured for performing multiplication operations by a set of filter multiplication coefficients. The multiplication circuit blocks may comprise bit shifting circuit blocks (e.g. 14, 14', $14_1$, $14_2$) configured for performing the set of multiplication operations by using alternatively a first set of approximate multiplication coefficients and a second set of approximate multiplication coefficients different from the first set of approximate multiplication coefficients. The approximate coefficients in the first set of approximate coefficients and the second set of approximate coefficients may approximate the multiplication coefficients in the set of filter multiplication coefficients as a function of negative power-of-two values (e.g. C1. The multiplication circuit blocks may include bit shifting circuit elements (e.g. 14, 14', $14_1$, $14_2$) performing the multiplication operations by means of bit shifting. Switching circuit blocks (e.g. 18) may be provided active on the multiplication circuit to produce alternation of multiplications with the first set of approximate coefficients and multiplications with the second set of approximate coefficients.

One or more embodiments may relate to a device, which may comprise a circuit according to one or more embodiments, a source circuit of a digital signal (e.g. X(n)) comprising a sequence of samples, the source circuit coupled to the input node of the circuit to apply the input digital signal thereto, and a user circuit coupled to the output node of the circuit to receive therefrom the filtered output digital signal (e.g. Y(n)).

Without prejudice to the underlying principles, the details and embodiments may vary, even significantly, with respect to what has been disclosed by way of example only, without departing from the extent of protection. The extent of protection is defined by the annexed claims.

What is claimed is:

1. A method comprising:
   receiving an input digital signal comprising a sequence of samples; and
   filtering the input digital signal by performing a set of multiplication operations by alternately using a first set of multiplication coefficients and a second set of multiplication coefficients different from the first set of multiplication coefficients, wherein each multiplication coefficient in the first set of multiplication coefficients and the second set of multiplication coefficients is a function of negative power-of-two values and the multiplication operations are performed by shifting, wherein the first and second sets of multiplication coefficients respectively comprise first and second sets of approximate multiplication coefficients that are selected to approximate a set of filter multiplication coefficients that, when applied to the input digital signal, will produce a filtered output digital signal with a corner frequency, and wherein the filtering produces a filtered output digital signal with an approximate corner frequency that approximates the corner frequency, wherein each of the approximate multiplication coefficients of the first and second sets are different from respective filter multiplication coefficients of the set of filter multiplication coefficients, and wherein the approximate corner frequency is different from the corner frequency.

2. The method of claim 1, wherein the multiplication coefficients in the first set of multiplication coefficients and the second set of multiplication coefficients comprise coefficients that approximate the multiplication coefficients in the set of filter multiplication coefficients as a difference between a unitary value and a negative power-of-two value.

3. The method of claim 1, wherein the sequence of samples of the input digital signal are clocked at a clock frequency, the method comprising alternating multiplication operations with the first set of multiplication coefficients and the second set of multiplication coefficients synchronously with the clock frequency.

4. The method of claim 1, wherein the sequence of samples of the input digital signal are clocked by a sequence of clock pulses at a clock frequency, the method comprising switching between multiplication operations with the first set of multiplication coefficients and multiplication operations with the second set of multiplication coefficients at each pulse in the sequence of clock pulses.

5. A method comprising:
   receiving an input digital signal comprising a sequence of samples;
   applying the input digital signal to digital filter processing with a corner frequency to produce a filtered output digital signal, the digital filter processing comprising a set of multiplication operations using a set of filter multiplication coefficients;
   performing the set of multiplication operations by alternately using a first set of approximate multiplication coefficients and a second set of approximate multiplication coefficients different from the first set of approximate multiplication coefficients;
   wherein the approximate multiplication coefficients in the first set of approximate multiplication coefficients and the second set of approximate multiplication coefficients in the set of filter multiplication coefficients as a function of negative power-of-two values; and
   wherein performing the set of multiplication operations results in digital filter processing with average corner frequency approximating the corner frequency, wherein each of the approximate multiplication coefficients of the first and second sets are different from respective filter multiplication coefficients of the set of filter multiplication coefficients, and wherein the average corner frequency approximating the corner frequency is different from the corner frequency.

6. The method of claim 5, wherein the sequence of samples of the input digital signal are clocked at a clock frequency, the method comprising alternating multiplication operations with the first set of approximate multiplication coefficients and the second set of approximate multiplication coefficients synchronously with the clock frequency.

7. The method of claim 6, wherein the sequence of samples of the input digital signal are clocked by a sequence of clock pulses at the clock frequency, the method comprising switching between multiplication operations with the first set of approximate multiplication coefficients and multiplication operations with the second set of approximate multiplication coefficients at each pulse in the sequence of clock pulses.

8. The method of claim 5, wherein the approximate multiplication coefficients in the first set of approximate multiplication coefficients and the second set of approximate multiplication coefficients comprise coefficients that approximate the filter multiplication coefficients in the set of filter multiplication coefficients as a difference between a unitary value and a negative power-of-two value.

9. The method of claim 5, comprising coupling a first approximate coefficient in the first set of approximate multiplication coefficients to a coefficient in the set of filter multiplication coefficients, the first approximate coefficient selected out of a plurality of candidate first approximate coefficients.

10. The method of claim 9, further comprising selecting the first approximate coefficient as a function of a difference between the corner frequency and the average corner frequency approximating the corner frequency.

11. The method of claim 5, comprising coupling a second approximate coefficient in the second set of approximate multiplication coefficients to a coefficient in the set of filter multiplication coefficients, the second approximate coefficient selected out of a plurality of candidate second approximate coefficients.

12. The method of claim 11, further comprising selecting the second approximate coefficient as a function of a difference between the corner frequency and the average corner frequency approximating the corner frequency.

13. The method of claim 5, comprising coupling a first approximate coefficient in the first set of approximate multiplication coefficients to a coefficient in the set of filter multiplication coefficients and coupling a second approximate coefficient in the second set of approximate multiplication coefficients to another coefficient in the set of filter multiplication coefficients, the first approximate coefficient selected out of a plurality of candidate first approximate coefficients and second approximate coefficient selected out of a plurality of candidate second approximate coefficients.

14. A circuit, comprising:
an input node configured to receive an input digital signal comprising a sequence of samples;
a digital filter processor coupled to the input node to receive the input digital signal, the digital filter processor comprising a set of bit shifting circuit blocks configured to perform a set of multiplication operations and a plurality of switching circuit blocks;
wherein the multiplication operations are performed by alternately using a first set of approximate multiplication coefficients and a second set of approximate multiplication coefficients different than the first set of approximate multiplication coefficients;
wherein the approximate multiplication coefficients in the first set of approximate multiplication coefficients and the second set of approximate multiplication coefficients approximate filter multiplication coefficients in a set of filter multiplication coefficients as a function of negative power-of-two values, wherein each of the approximate multiplication coefficients of the first and second sets are different from respective filter multiplication coefficients of the set of filter multiplication coefficients;
wherein the filter multiplication coefficients define a corner frequency and the approximate multiplication coefficients define an approximate corner frequency that approximates the corner frequency, the approximate corner frequency being different from the corner frequency;
wherein the bit shifting circuit blocks include bit shifting circuit elements configured to performed the multiplication operations by bit shifting; and
wherein the switching circuit blocks are provided active with the bit shifting circuit blocks to implement alternating multiplication operations with the first set of approximate multiplication coefficients and the second set of approximate multiplication coefficients.

15. A device, comprising:
the circuit according to claim 14,
a source circuit of the input digital signal comprising the sequence of samples, the source circuit coupled to the input node of the circuit; and
a user circuit coupled to an output node of the circuit to receive a filtered output digital signal.

16. The circuit of claim 14, wherein a first bit shifting circuit element of a first bit shifting circuit block of the set of bit shifting circuit blocks has an output coupled to a first input of a switch circuit of a first switching circuit block of the plurality of switching circuit blocks, wherein a second bit shifting circuit element of the first bit shifting circuit block has an output coupled to a second input of the switch circuit of the first switching circuit block, and wherein an input of the first bit shifting circuit element is directly connected to an input of the second bit shifting circuit element.

17. A method comprising:
receiving an input digital signal comprising a sequence of samples;
determining a set of filter multiplication coefficients that can be used for filtering the input digital signal;
determining a first set of approximate multiplication coefficients and a second set of approximate multiplication coefficients based on the filter multiplication coefficients, the first and second sets of approximate multiplication coefficients having negative power-of-two values; and
performing a set of multiplication operations by alternately using the first set of approximate multiplication coefficients and the second set of approximate multiplication coefficients, wherein the set of filter multiplication coefficients define a digital filter with a corner frequency and wherein performing the set of multiplication operations result in digital filter processing with average corner frequency approximating but different than the corner frequency.

18. The method of claim 17, wherein the multiplication operations are performed using shifting operations.

19. The method of claim 17, wherein the input digital signal is received at a clock frequency and wherein performing the set of multiplication operations comprises alternating multiplication operations with the first set of approximate multiplication coefficients and the second set of approximate multiplication coefficients synchronously with the clock frequency.

20. The method of claim 17, wherein the input digital signal is received synchronously with a sequence of clock pulses at a clock frequency and wherein performing the set of multiplication operations comprises switching between multiplication operations with the first set of approximate multiplication coefficients and multiplication operations with the second set of approximate multiplication coefficients at each pulse in the sequence of clock pulses.

21. The method of claim 17, wherein determining the first set of approximate multiplication coefficients comprises selecting approximate multiplication coefficients from a predetermined set of multiplication coefficients, wherein determining the second set of approximate multiplication coefficients comprises selecting approximate multiplication coefficients from the predetermined set of multiplication coefficients, and wherein determining the first and second sets of approximate multiplication coefficients comprises selecting the approximate multiplication coefficients from the predetermined set of multiplication coefficients so that the average corner frequency is closest to the corner frequency.

22. The method of claim 17, wherein the digital filter is a high-pass digital filter.

* * * * *